(12) United States Patent
Chan et al.

(10) Patent No.: US 7,545,008 B2
(45) Date of Patent: Jun. 9, 2009

(54) COMPLEMENTARY METAL-OXIDE-SEMICONDUCTOR TRANSISTOR STRUCTURE FOR HIGH DENSITY AND HIGH PERFORMANCE INTEGRATED CIRCUITS

(75) Inventors: Philip Ching Ho Chan, Hong Kong (CN); Man Sun Chan, Hong Kong (CN); Xusheng Wu, Hong Kong (CN); Shengdong Zhang, Beijing (CN)

(73) Assignee: The Hong Kong University of Science and Technology, Hong Kong SAR (CN)

( * ) Notice: Subject to any disclaimer, the term of this patent is extended or adjusted under 35 U.S.C. 154(b) by 407 days.

(21) Appl. No.: 11/347,164

(22) Filed: Feb. 3, 2006

(65) Prior Publication Data

US 2007/0181947 A1    Aug. 9, 2007

(51) Int. Cl.
*H01L 27/088* (2006.01)
(52) U.S. Cl. .................... 257/401; 257/67; 257/69; 257/350; 257/351; 257/E27.057; 257/E27.064; 257/E29.273
(58) Field of Classification Search .................. 257/67, 257/69, 350, 351, 401, E27.057, E27.064, 257/E29.273
See application file for complete search history.

(56) References Cited

U.S. PATENT DOCUMENTS

| | | | |
|---|---|---|---|
| 4,996,574 A | 2/1991 | Shirasaki | 357/23.7 |
| 6,291,858 B1 | 9/2001 | Ma et al. | 257/350 |
| 6,451,634 B2 | 9/2002 | Ma et al. | 438/155 |
| 6,611,029 B1 | 8/2003 | Ahmed et al. | 257/365 |
| 6,727,517 B2 | 4/2004 | Chan et al. | 257/66 |
| 6,794,306 B2 | 9/2004 | Kim et al. | 438/752 |
| 2003/0178677 A1* | 9/2003 | Clark et al. | 257/347 |
| 2003/0215989 A1* | 11/2003 | Kim et al. | 438/157 |

OTHER PUBLICATIONS

Yamazaki et al; "4-Layer 3-D Technologies for Parallel Signal Processing", *IEDM, IEEE*, 599-602 (1990).

(Continued)

*Primary Examiner*—Ngan Ngo
*Assistant Examiner*—Benjamin Tzu-Hung Liu
(74) *Attorney, Agent, or Firm*—Heslin Rothenberg Farley & Mesiti P.C.

(57) ABSTRACT

A semiconductor device may include a substrate and an insulating layer formed on the substrate. A multi-layer fin may be formed on the insulating layer and may include two semiconducting layers isolated by an insulating layer in vertical direction. A first MOS type device comprising a first source region, a first channel region and a first drain region is arranged on the first semiconducting layer in the multi-layer fin. A second MOS type device comprising a second source region, a second channel region and a second drain region is arranged on the second semiconducting layer in the multi-layer fin. A gate electrode is provided so as to be vertically adjacent to the first and second channel regions.

30 Claims, 6 Drawing Sheets

OTHER PUBLICATIONS

Abou-Samra et al., "3D CMOS SOI for High Performance Computing", *ACM* 54-58 (1998).

Subramanian et al., "High Performance Germanium-Seeded Laterally Crystallized TFT's for Vertical Device Integration", *IEEE Transactions on Electron Devices*, 45(9) 1934-1939 (1998).

Chan et al., "Three Dimensional CMOS Integrated Circuits on Large Grain Polysilicon Films", *IEDM, IEEE*, 161-164 (2000).

Sailer et al., "Creating 3D Circuits Using Transferred Films", *Circuits & Devices, IEEE*, 27-30 (1997).

Chang et al., "FinFET Scaling to 10nm Gate Length", *IEDM, IEEE*, 251-254 (2002).

* cited by examiner

COMPLEMENTARY METAL-OXIDE-SEMICONDUCTOR TRANSISTOR STRUCTURE FOR HIGH DENSITY AND HIGH PERFORMANCE INTEGRATED CIRCUITS

FIELD OF THE INVENTION

The present invention relates to methods for fabricating high density and high performance integrated circuits. The invention further relates to semiconductor devices and methods of manufacturing semiconductor devices.

BACKGROUND OF THE INVENTION

Three-dimensional integrated circuits (IC) are considered to be one of the most promising methods for implementing future high density and performance IC applications. It is hoped that multiple layer IC circuits will have all the advantages of SOI devices and many other advantages. Specifically, their cell area will be reduced and their circuit density improved. Also, total interconnect lengths are shortened by using vertical connections, thus lowering the RC delay and power consumption.

Such 3-D ICs with multilayer devices have been fabricated layer by layer like the stacking of a sandwich with thick isolation material between the various layers. However, there are still many challenges in developing 3-D technology. Firstly, one major challenge is how to build high quality single crystallized silicon on an insulating material to form the second and subsequent layers. Several methods have been reported, such as laser re-crystallization [K. Yamazaki, Y. Itoh, A. Wada, K. Morimoto and Y. Tomita, "4-layer 3-D IC technologies for parallel signal processing", IEDM, pp. 599-602, 1990], and selective lateral overgrowth epitaxy [S. J. Abou-Samra, P. A. Aisa, A. Guyot and B. Courtois, "3-D MOS SOI for High Performance Computing", Low Power Electronics and Design Proc., pp. 54-58, 1998.]. However, the methods mentioned are complicated and may cause dislocation defects. Another recent method uses a germanium or nickel seed to re-crystallize the polysilicon film laterally, but the grain size is limited and it will introduce metal contamination [V. Subramanian, K. C. Saraswat, "High-Performance Germanium-Seeded Laterally Crystallized TFTs for Vertical Device Integration", IEEE Trans. Elec. Devices, Vol. 45, No. 9, p 1934-1939, 1998 and V. W. C. Chan, P. C. H. Chan, and M. Chan, "Three Dimensional CMOS Integrated Circuit on Large Grain Polysilicon Films", IEEE International Electron Device Meeting, pp. 161-164, 2000.]. Bounding techniques can supply single crystal silicon film for second and subsequent active layers [P. M. Sailer, P. Singhal, J. Hopwood, D. R. Kaeli, P. M. Zavraky, K. Warner, and D. P. Yu, "Creating 3D Circuit Using Transferred Films", IEEE Circuit and Device, vol. 13, pp. 27-30, November 1997.], but the bounding conditions and alignment requirements still prevents this technique from being used extensively in the fabrication of real 3-D ICs.

Secondly, thermal budget restrictions present a further challenge. After forming the bottom layer devices, any high temperature process steps affect the devices on the bottom layer. One of obvious results is channel shorting for bottom layer devices, even punch through. That will limit the scaling of bottom layer devices and result in asymmetry between top and bottom devices.

Finally, even with high quality silicon material and well-designed thermal processes, the devices fabricated on each active layer will still face similar scaling limitations to conventional planar design. A FinFET is a recent double-gate structure that exhibits good short channel behavior [B. Yu, L. Chang, S. Ahmed, H. Wang, S. Bell, C. Y. Yang, C. Tabery, C. Ho, Q. Xiang, T. J. King, J. Bokor, C. Hu, M. R. Lin, and D. Kyser, "FinFET Scaling to 10 nm Gate Length", IEEE International Electron Device Meeting, pp. 251-254, 2002]. A FinFET includes a channel formed in a vertical fin. The FinFET structure may be fabricated using layout and process techniques similar to those used for conventional planar MOSFETs. The FinFET has been considered the most promising candidate for the next scaling generation.

It would, therefore, be a distinct advantage to provide a 3-D technology that has high quality single crystallized silicon material for the second and subsequent layers, may be fabricated using a simple process, process freedom from thermal budget, and scaling potential for devices.

SUMMARY OF THE INVENTION

According to the present invention there is provided A semiconductor device, comprising; a substrate; a first insulating layer formed on the substrate; a multi-layer fin formed on the insulating layer and including a first semiconductor fin layer on the first insulating layer, a second insulating fin layer on the first semiconductor fin layer, and a second semiconductor fin layer on the second insulating fin layer, and the multi-layer fin including two side surfaces and a top surface; a gate oxide layer formed on both side surfaces of at least an active region of the multi-layer fin; a dielectric layer which is formed on the top surface of said multi-layer fin with a thickness greater or equal to that of the gate oxide; and a gate formed on said first insulating layer and third oxide layer proximate to the side surfaces and the top surface of said multi-layer fin.

The dielectric layer formed on the top surface of said multi-layer fin may comprise either an extension of said gate oxide layer or comprises a residual mask portion remaining following an etching process used to form the multi-layer fin if the mask is a hard mask that is not removed following the etching process.

In preferred embodiments of the invention the first and second semiconductor fin layers may comprise silicon and/or germanium; the gate may comprise n+ doped or p+ doped polysilicon; the first insulating layer may comprise a first buried oxide layer; and the second insulating fin layer may comprise a second buried oxide layer.

Preferably the semiconductor device further comprises a first source region and a first drain region formed above the first insulating layer and adjacent a respective first and second end of the first semiconductor fin of the multi-layer fin. The first source and drain regions may comprise at least one of silicon and germanium. The semiconductor device preferably further comprises; a second insulating source region and a second insulating drain region formed respectively above the first source region and drain region and adjacent a respective first and second end of the second insulating fin of the multi-layer fin. The second insulating source and drain regions may preferably comprise regions of the second buried oxide layer Preferably, a second source region and a second drain region may be formed respectively above the second insulating source region and drain region and adjacent a respective first and second end of the second semiconductor fin of the multi-layer fin. The second source and drain regions may comprise at least one of silicon and germanium.

According to another broad aspect the present invention also provides a semiconductor device, comprising; a substrate; a first insulating layer formed on the substrate; a multilayer fin formed on the insulating layer and including a first semiconductor fin layer on the first insulating layer, a second insulating fin layer on the first semiconductor fin layer, and a second semiconductor fin layer on the second insulating fin layer, the multi-layer fin including two side surfaces and a top surface; a gate dielectric layer formed on both side surfaces of the multi-layer fin region; a dielectric layer formed on the top surface of said multi-layer fin; a gate formed on said gate dielectric layer and dielectric layer proximate to the side surfaces and the top surface of said multi-layer fin.

BRIEF DESCRIPTION OF THE DRAWINGS

Several embodiments of the invention will now be described by way of example and with reference to the accompanying drawings in which:—

DETAILED DESCRIPTION OF PREFERRED EMBODIMENTS

Figure 1:
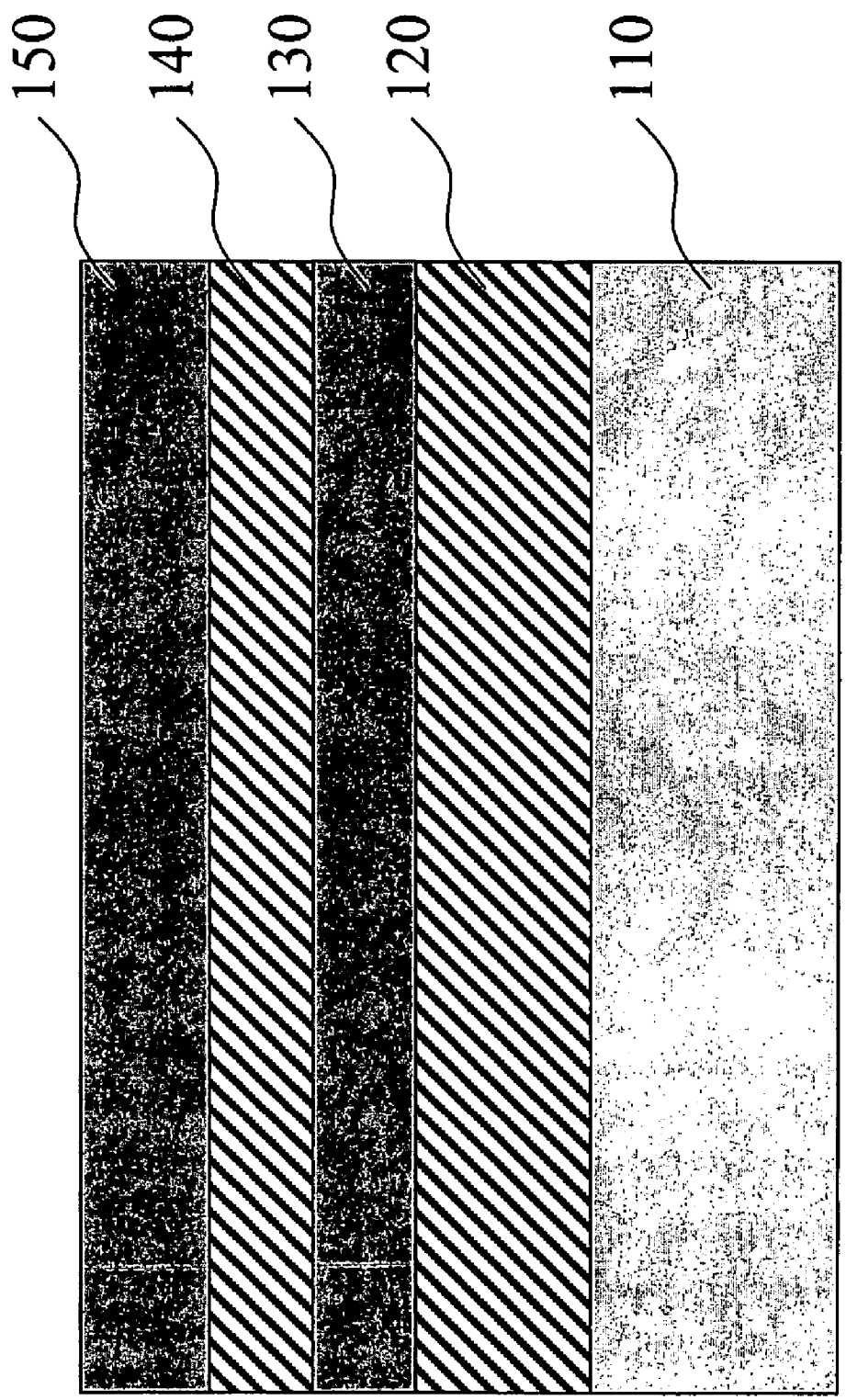
FIG. 1 is a cross-section illustrating exemplary layers that may be used for forming a multi-layer fin in accordance with an embodiment of present invention.

FIG. 1 illustrates the cross-section of a multi-layer semiconductor structure from which a semiconductor device may be formed in accordance with an embodiment of the present invention. Referring to FIG. 1, the multi-layer semiconductor structure may include a double-silicon on insulator (DSOI) structure that includes a silicon substrate 110, a bottom buried oxide layer 120, a bottom silicon layer 130, a top buried oxide layer 140 and a top silicon layer 150. The buried oxide layers 120, 140 and silicon layers 130, 150 may be formed on substrate 110 using SIMOX technology with double-oxygen implantations. The thickness of each layer may be adjusted through changing the dose and energy of the two oxygen implantations. The top silicon layer thickness may be further increased using epitaxy technology. Alternatively, the multi-layer structure may be formed using wafer-bonding techniques. The thickness of each layer may be adjusted through changing the starting parameters of the bonding material. Also, for some applications the bottom silicon layer 130 or top silicon layer 150 may be polycrystalline silicon material and may be formed on the substrate 110 using deposition techniques. Accordingly, the bottom buried oxide layer 120 and the top buried oxide layer 140 may be formed on the substrate 110 using thermal oxidation or deposition technologies or combinations thereof. Further, the multi-layer structure may be formed using the combinations of the techniques mentioned above.

In an exemplary implementation, bottom buried oxide layer 120 may comprise a silicon oxide and may have a thickness ranging from about 1000 Å to about 3000 Å. Bottom silicon layer 130 may comprise monocrystalline or polycrystalline silicon having a thickness ranging from about 300 Å to about 1500 Å. Top buried oxide layer 140 may comprise a silicon oxide and may have a thickness ranging from about 200 Å to about 1000 Å. Top silicon layer 150 may comprise monocrystalline or polycrystalline silicon having a thickness ranging from about 300 Å to about 1500 Å. Top silicon layer 150 and bottom silicon layer 130 are used to form fin structures for the SF-CMOS transistor devices, as described in more detail below. Top buried oxide layer 140 serves as the isolation layer between the top and bottom devices.

In alternative implementations consistent with the present invention, substrate 110, layer 130 and layer 150 may comprise other semiconducting materials, such as germanium, or combinations of semiconducting materials, such as silicon-germanium. Buried oxide layers 120 and 140 may also include other dielectric materials.

Figure 2:
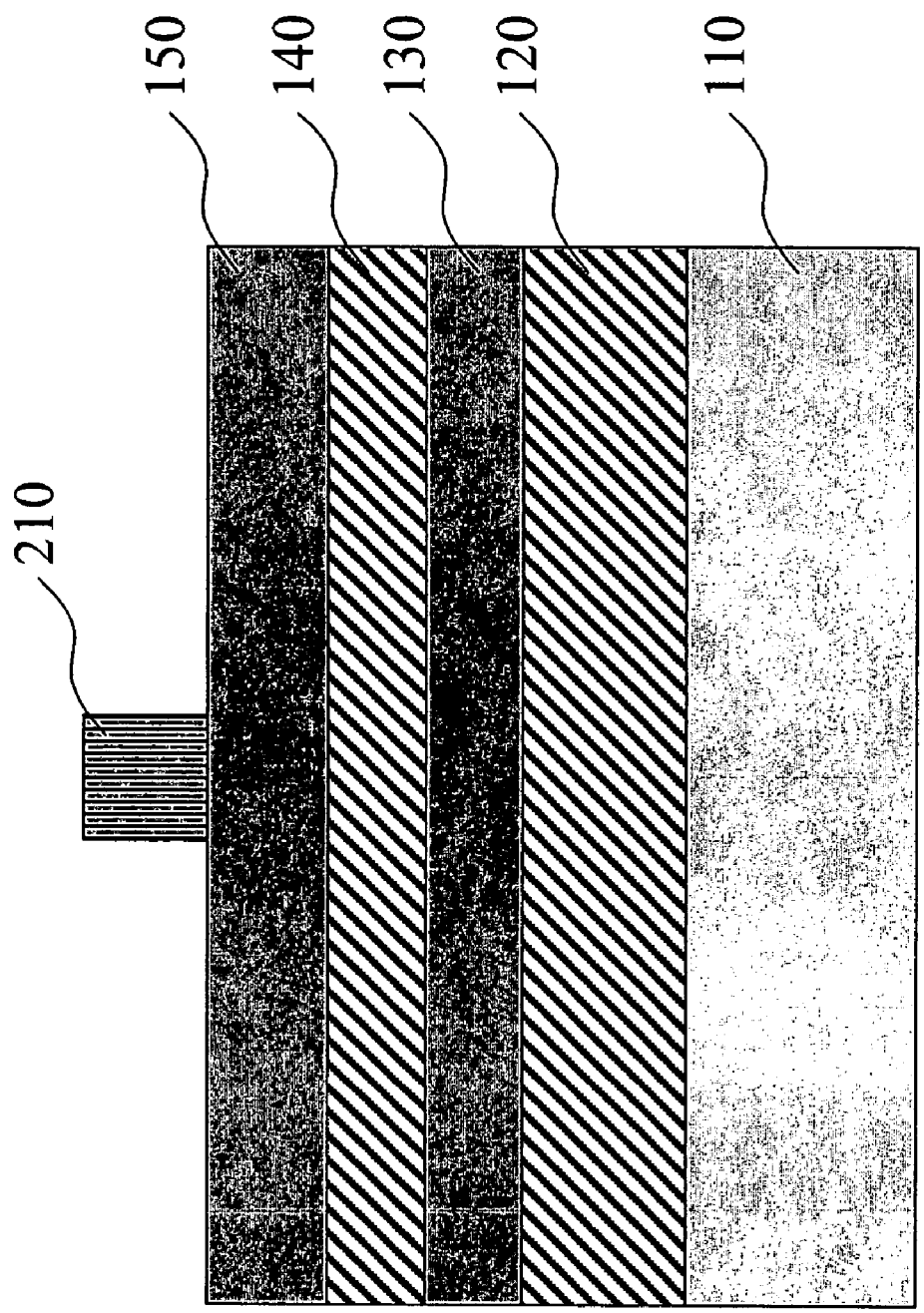
FIG. 2 illustrates a cross-section after the formation of a mask for forming a multi-layer fin in accordance with an embodiment of present invention.

FIG. 2 illustrates the cross-section of a fin mask 210 on semiconductor layer 100. Mask 210 for the multi-layer fin may be photoresist mask deposited and patterned in any conventional manner. Alternatively, mask 210 may be a hard-mask formed using other materials, such as silicon nitride, silicon and silicon oxide combination material, and any other suitable materials having high etching selectivity with the multi-layer fin material 130, 140 and 150. Also, hard-mask 210 may be formed using any conventional methods, such as a spacer method, trimming method etc.

Figure 3A:
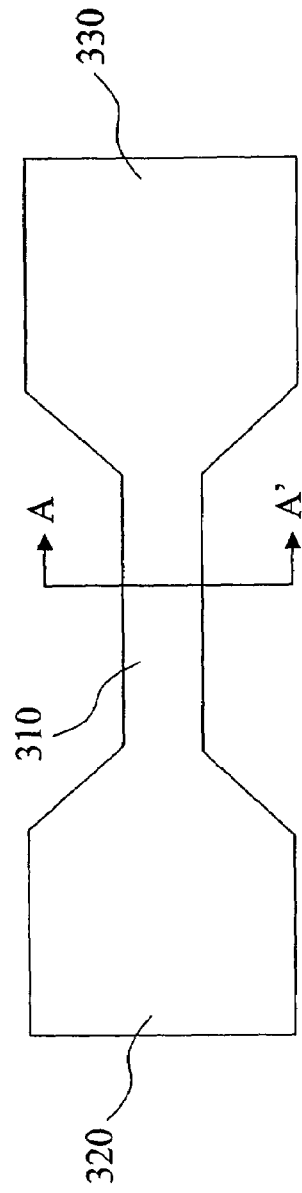
FIGS. 3(A) and 3(B), show (A) the top-view and (B) cross-section view of the formation of the multi-layer fin in accordance with an embodiment of present invention.
Figure 3B:
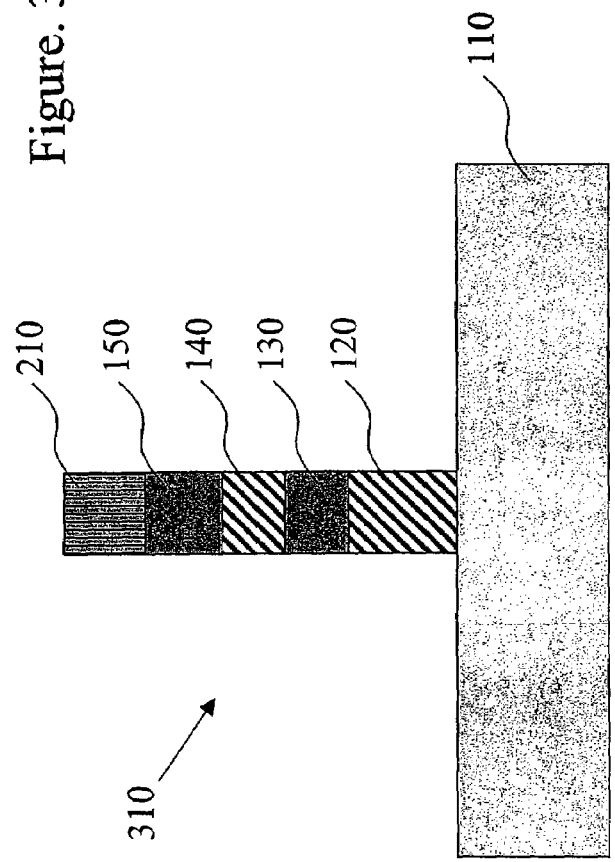

The multi-layer semiconductor structure may then be etched and the photoresist mask 210 may be removed or kept if it is a hard-mask as illustrated in FIG. 3B. In an exemplary implementation, top silicon layer 150, top buried oxide layer 140 and bottom silicon layer 130 may be etched in a conventional manner, with the etching terminating on bottom buried oxide layer 120 to form a multi-layer fin. Source and drain regions may be formed synchronously with the multi-layer fin formation or adjacent the respective ends of the multi-layer fin. For example, in an exemplary embodiment, a layer of silicon, germanium or combination of silicon and germanium may be deposited, patterned and etched in a conventional manner to form source and drain regions. This source/drain formation may be sequentially performed for the bottom devices and the top devices with an isolation layer, such as silicon dioxide, deposited in between.

FIG. 3A schematically illustrates the top view of a multi-layer fin structure on semiconductor formed in such a manner. Source/drain regions 320 and 330 may include the stacked source/drain structures for top and bottom devices respectively.

FIG. 3B is a cross-section along line A-A' in FIG. 3A illustrating the multi-layer fin structure in accordance with an exemplary embodiment of the present invention. Silicon layers 130 150 and top buried oxide layer 140 have been etched to form multi-layer fin 310. Multi-layer fin 310 may include silicon layers 130 150, top buried oxide layer 140 and a hard-mask cap 210.

Figure 4:
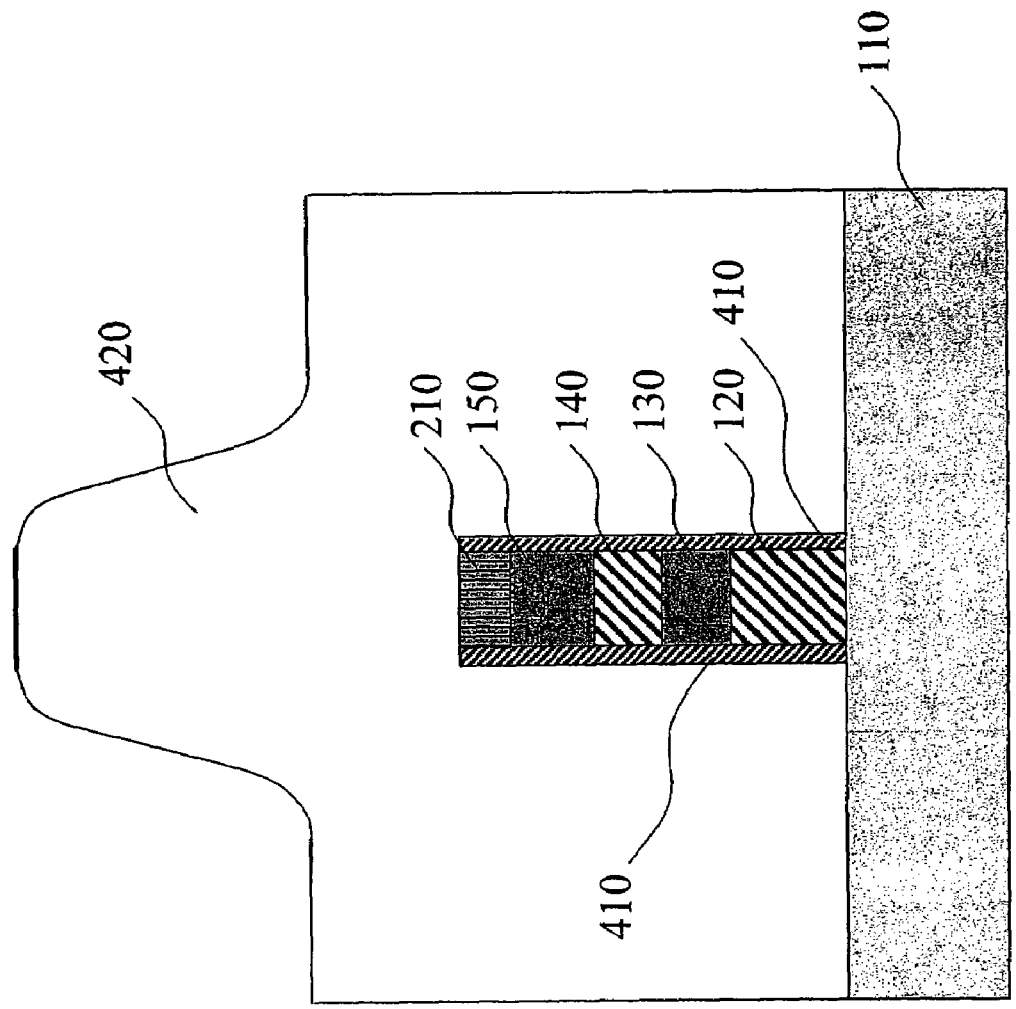
FIG. 4 illustrates a cross-section of the formation of a gate dielectric layer and gate material on the device of FIG. 3(B) in accordance with an embodiment of present invention.

FIG. 4 illustrates the cross-section of the formation of a gate dielectric layer and gate material on multi-layer fin 310 in accordance with an exemplary embodiment of the present invention. A dielectric layer may be formed on multi-layer fin 310. For example, a thin oxide film 410 may be thermally grown on multi-layer fin 310, as illustrated in FIG. 4. The oxide film 410 may be grown to a thickness of about 10 Å to about 100 Å and may be formed on the exposed side surfaces of silicon 130 150 in multi-layer fin 310 to act as a dielectric layer for gate electrode formation. Other possible materials for the gate dielectric layer include materials with high dielectric constant, such as hafnium oxide, aluminum oxide, hafnium aluminum oxide, zirconium oxide, zirconium silicon oxide, titanium oxide, tantalum oxide, silicon nitride, barium oxide, barium zirconium oxide, barium titanium oxide, etc.

A gate material layer 420 may be deposited over semiconductor device 100 after formation of the oxide film 410. The gate material layer 420 may comprise the material for the subsequently formed gate electrode that is shared by devices on the top and bottom active layers. In an exemplary implementation, the gate material layer 420 may include polysilicon deposited using conventional chemical vapor deposition (CVD) to a thickness ranging from about 300 Å to about 5000 Å. Alternatively, other semiconducting materials, such as germanium and combinations of silicon and germanium, or various metals, may be used as the gate material. Other possible gate materials include metals selected from the group comprising nickel, molybdenum, tungsten, platinum, lanthanum.

Figure 5:
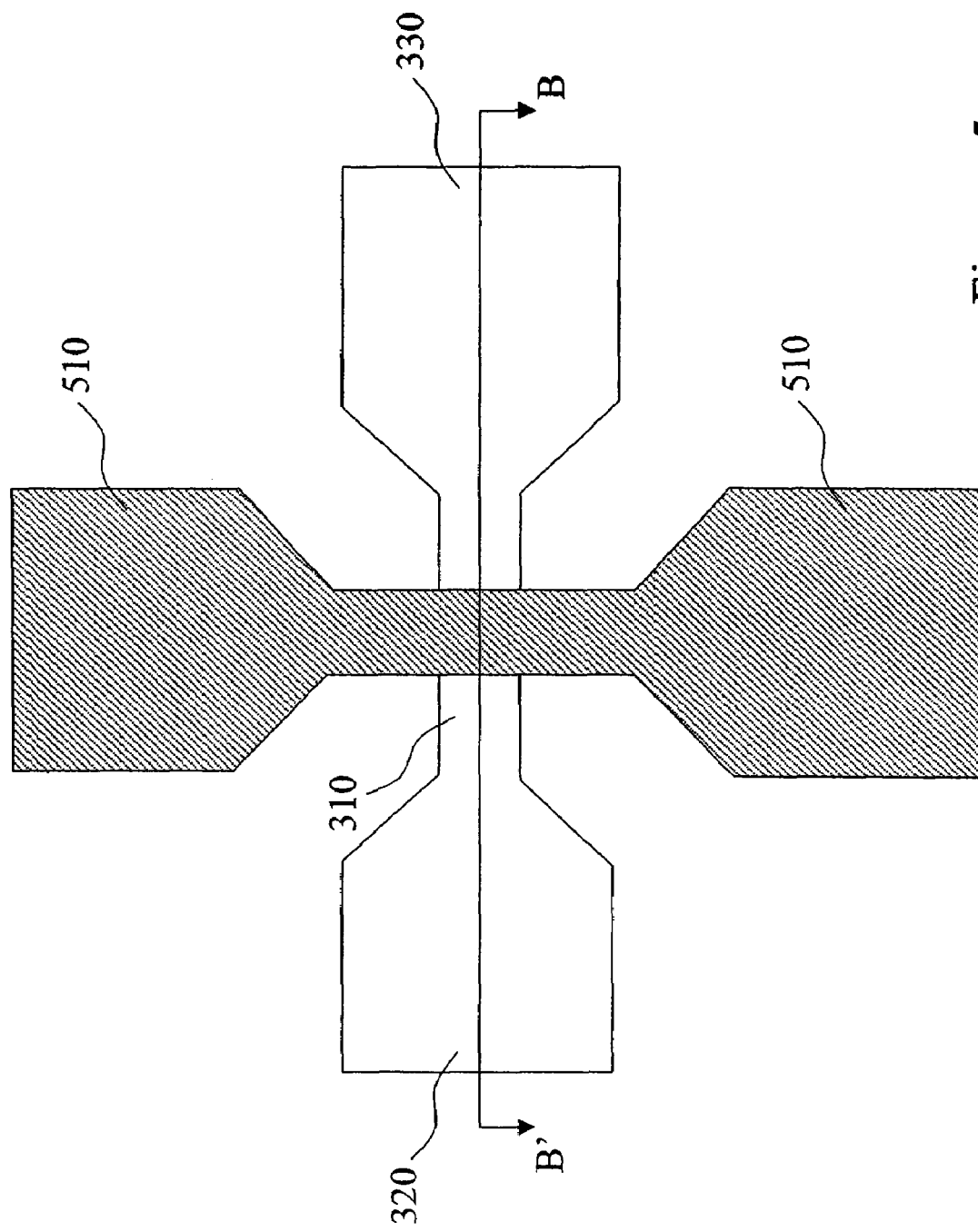
FIG. 5, schematically illustrates the top-view of the device after the formation of gate in accordance with an embodiment of present invention.

The shared gate 510 may be photo-lithographically defined in the gate material layer 420 as schematically illustrated the top view in FIG. 5. Gate material layer 420 may be selectively etched to form a gate structure shared by devices on the top and bottom active layers on device 100. Forming the gate structure in such a manner may leave some gate material 420 on top of the hard-mask cap 210. Alternatively, the mask cap 210 may have been removed and the gate material 420 left on the top of the multi-layer fin may act as another gate controlling the top device on silicon layer 150.

Figure 6:
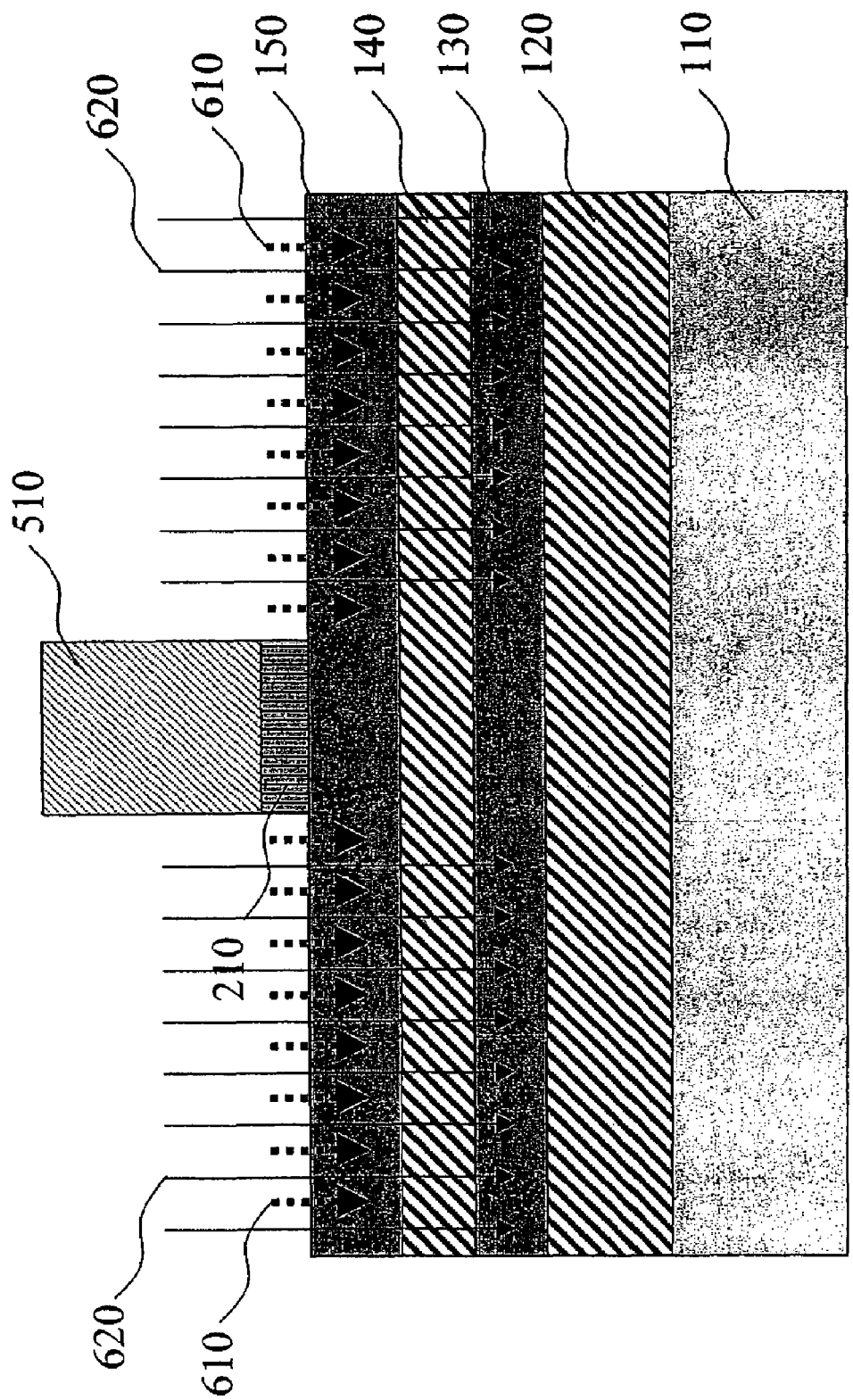
FIG. 6 schematically illustrates the series source/drain implantation methodology for forming the SF-CMOS device in accordance with an embodiment of present invention.

After removal of the hard-mask layer 210 on top of source/drain regions 320 and 330, the source/drain regions 320 and 330 may then be doped in a series manner. As illustrated in FIG. 6 (cross-section along line B-B' in FIG. 5), the series implantations may include top device source/drain implantation 610 and bottom device source/drain implantation 620. For example, n-type and p-type impurities may be implanted in source/drain regions of top and bottom devices respectively. The particular implantation dosages and energies for the series implantations may be selected based on the particular end device and circuit requirements. In addition, sidewall spacers may optionally be formed prior to the series source/drain implantations 610 and 620, or alternatively prior to source/drain implantation 620 while after source/drain implantation 610, to control the location of the source/drain junctions based on particular circuit requirements. Activation annealing may then be performed to activate the source/drain regions 320 and 330.

Finally, contact and interconnect processes may be performed to complete the 3-D SF-CMOS structure. Thus, in accordance with the present invention, a 3-D stacked fin CMOS device is formed with one MOSFET stacking on another MOSFET. Advantageously, the resulting structure exhibits highly compact 3-D circuit configuration. Both top and bottom layers 130 and 150 may be monocrystalline silicon material and devices on such layer may show improved performance compared with devices on polycrystalline or re-crystallized silicon material used in existing 3-D technology. In addition, the present invention uses only simple processes and can be easily integrated into conventional 2-D processing.

In general terms, it will be seen that at least in preferred embodiments the present invention provides a Stacked Fin-CMOS (SF-CMOS) device structure. A source region, a channel region and a drain region of a MOS device are arranged on a silicon fin(s) structure. Further, another set of source region, channel region and drain region may be arranged with another silicon fin(s) stacking on the previous device with an isolation layer interposed between the stacked silicon fin(s)'s. In this way a Π shape gate may straddle on the stacked multi-layer fin(s) and serve as the shared gate for both the top device and the bottom device.

An advantage of the present invention, at least in its preferred forms, is that it may provide a semiconductor device of high density by realizing a 3-D compact design with CMOS devices stacked on each other. This 3-D technology is simple and effective compared with all existing 3-D layer-by-layer structures. Further, this SF-CMOS technology may have more that just two active layers of circuit elements.

Another advantage of the present invention is to provide a semiconductor device of high performance and scalability for 3-D design. Inherent in FinFET design, the present invention may show good scalability. With the utilization of double layer silicon on insulator (SOI) material, the present invention makes it possible to solve the problem of poor performance of transistors formed on polysilicon or re-crystallized silicon film in existing 3-D technology.

The invention claimed is:

1. A semiconductor device, comprising;
a substrate;
a first insulating layer formed on the substrate;
a multi-layer fin formed on the insulating layer and including a first semiconductor fin layer on the first insulating layer, a second insulating fin layer on the first semiconductor fin layer, and a second semiconductor fin layer on the second insulating fin layer, and the multi-layer fin including two side surfaces and a top surface;
a gate oxide layer formed on both side surfaces of at least an active region of the multi-layer fin;
a dielectric layer which is formed on the top surface of said multi-layer fin with a thickness greater or equal to that of the gate oxide layer; and
a gate formed on said first insulating layer and third oxide layer proximate to the side surfaces and the top surface of said multi-layer fin.

2. A semiconductor device as claimed in claim 1 wherein said dielectric layer formed on the top surface of said multi-layer fin comprises either an extension of said gate oxide layer or comprises a residual mask portion remaining following an etching process used to form said multi-layer fin.

3. A semiconductor device as claimed in claim 1, wherein said first and second semiconductor fin layers comprise silicon and/or germanium.

4. A semiconductor device as claimed in claim 1, wherein said gate comprises n+ doped or p+ doped polysilicon.

5. A semiconductor device as claimed in claim 1, wherein said first insulating layer comprises a first buried oxide layer.

6. A semiconductor device as claimed in claim 1, wherein said second insulating fin layer comprises a second buried oxide layer.

7. A semiconductor device as claimed in claim 1, further comprising; a first source region and a first drain region formed above said first insulating layer and adjacent a respective first and second end of said first semiconductor fin of said multi-layer fin.

8. A semiconductor device as claimed in claim 7 wherein said first source and drain regions comprise at least one of silicon and germanium.

9. A semiconductor device as claimed in claim 7, further comprising; a second insulating source region and a second insulating drain region formed respectively above said first source region and drain region and adjacent a respective first and second end of said second insulating fin of said multi-layer fin.

10. A semiconductor device as claimed in claim 9 wherein said second insulating source and drain regions comprise regions of said second buried oxide layer.

11. A semiconductor device as claimed in claim 7, further comprising; a second source region and a second drain region formed respectively above said second insulating source region and drain region and adjacent a respective first and second end of said second semiconductor fin of said multi-layer fin.

12. A semiconductor device as claimed in claim 11 wherein said second source and drain regions comprise at least one of silicon and germanium.

13. A semiconductor device as claimed in claim 1 wherein said dielectric layer formed on the top surface of said multi-layer fin has a thickness greater than that of the gate oxide layer.

14. A semiconductor device as claimed in claim 1 wherein said dielectric layer formed on the top surface of said multi-layer fin comprises a photoresist mask.

15. A semiconductor device as claimed in claim 1 wherein said dielectric layer formed on the top surface of said multi-layer fin comprises a hard mask.

16. A semiconductor device, comprising;
a substrate;
a first insulating layer formed on the substrate;
a multi-layer fin formed on the insulating layer and including a first semiconductor fin layer on the first insulating layer, a second insulating fin layer on the first semiconductor fin layer, and a second semiconductor fin layer on the second insulating fin layer, the multi-layer fin including two side surfaces and a top surface;
a gate dielectric layer formed on both side surfaces of the multi-layer fin region;
a dielectric layer formed on the top surface of said multi-layer fin; and
a gate formed on said gate dielectric layer and dielectric layer proximate to the side surfaces and the top surface of said multi-layer fin.

17. A semiconductor device as claimed in claim 16, wherein said first and second semiconductor fin layers comprise at least one of silicon and germanium.

18. A semiconductor device as claimed in claim 16, wherein said gate dielectric layer comprises a material having a high dielectric constant, said material being selected from the group consisting of hafnium oxide, aluminum oxide, hafnium aluminum oxide, zirconium oxide, zirconium silicon oxide, titanium oxide, tantalum oxide, silicon nitride, barium oxide, barium zirconium oxide, and barium titanium oxide.

19. A semiconductor device as claimed in claim 16, wherein said gate is a metal selected from the group consisting of nickel, molybdenum, tungsten, platinum, and lanthanum.

20. A semiconductor device as claimed in claim 16, wherein said first insulating layer comprises a first buried oxide layer.

21. A semiconductor device as claimed in claim 16, wherein said second insulating fin layer comprises a second buried oxide layer.

22. A semiconductor device as claimed in claim 16, further comprising; a first source region and a first drain region formed above said first insulating layer and adjacent a respective first and second end of said first semiconductor fin of said multi-layer fin.

23. A semiconductor device as claimed in claim 22 wherein said first source and drain regions comprise at least one of silicon and germanium.

24. A semiconductor device as claimed in claim 22, further comprising; a second insulating source region and a second insulating drain region formed respectively above said first source region and drain region and adjacent a respective first and second end of said second insulating fin of said multi-layer fin.

25. A semiconductor device as claimed in claim 24 wherein said second insulating source and drain regions comprise regions of said second buried oxide layer.

26. A semiconductor device as claimed in claim 22, further comprising; a second source region and a second drain region formed respectively above said second insulating source region and drain region and adjacent a respective first and second end of said second semiconductor fin of said multi-layer fin.

27. A semiconductor device as claimed in claim 26 wherein said second source and drain regions comprises at least one of silicon and germanium.

28. A semiconductor device as claimed in claim 16 wherein said dielectric layer formed on the top surface of said multi-layer fin has a thickness greater than that of the gate dielectric layer.

29. A semiconductor device as claimed in claim 16 wherein said dielectric layer formed on the top surface of said multi-layer fin comprises a photoresist mask.

30. A semiconductor device as claimed in claim 16 wherein said dielectric layer formed on the top surface of said multi-layer fin comprises a hard mask.

* * * * *